United States Patent
Lee et al.

(10) Patent No.: US 8,044,578 B2
(45) Date of Patent: Oct. 25, 2011

(54) ORGANIC ELECTROLUMINESCENCE DISPLAY DEVICE AND METHOD OF FABRICATING THE SAME

(75) Inventors: Jae Yoon Lee, Seoul (KR); Joon Suk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 375 days.

(21) Appl. No.: 11/821,147

(22) Filed: Jun. 22, 2007

(65) Prior Publication Data

US 2008/0001524 A1  Jan. 3, 2008

(30) Foreign Application Priority Data

Jun. 30, 2006 (KR) .................. 10-2006-0060104

(51) Int. Cl.
 *H01L 51/52* (2006.01)
 *G09G 3/14* (2006.01)
 *H01J 9/00* (2006.01)

(52) U.S. Cl. ............... 313/506; 313/504; 315/169.3; 445/24

(58) Field of Classification Search .......... 313/503–506, 313/512; 315/169.3; 445/23–25
See application file for complete search history.

(56) References Cited

U.S. PATENT DOCUMENTS

| 4,218,532 A * | 8/1980 | Dunkleberger ............... 430/314 |
| 2005/0247936 A1* | 11/2005 | Bae et al. ........................ 257/59 |
| 2006/0119259 A1* | 6/2006 | Bae et al. ....................... 313/506 |

OTHER PUBLICATIONS

U.S. Appl. No. 11/288,302.*
Combined Search and Examination Report for corresponding United Kingdom Application Serial No. 0711437.4, dated Oct. 12, 2007.

* cited by examiner

*Primary Examiner* — Nimeshkumar Patel
*Assistant Examiner* — Steven Horikoshi
(74) *Attorney, Agent, or Firm* — Brinks Hofer Gilson & Lione

(57) ABSTRACT

The display device includes a first substrate, a second substrate, a spacer and a connection electrode. The first substrate includes an organic electroluminescence diode device, and the second substrate faces the first substrate and includes a thin film transistor. The connection electrode is configured to electrically connect the thin film transistor and the organic electroluminescence diode device. The display device further includes a first buffer pattern configured to separate two adjacent pixel regions and a second buffer pattern overlying the first buffer pattern and having a predetermined shape. The first buffer pattern is etchable to produce a cavity between the two adjacent pixel regions. The cavity can be enlarged to the extent that the shape of the second buffer pattern is maintained.

11 Claims, 4 Drawing Sheets

ORGANIC ELECTROLUMINESCENCE DISPLAY DEVICE AND METHOD OF FABRICATING THE SAME

PRIORITY CLAIM

The present application claims the benefit of Korean Patent Application No. 2006-060104 filed in Korea on Jun. 30, 2006, which is hereby incorporated by reference.

BACKGROUND

1. Field of the Invention

The present invention relates to an organic electroluminescence display device, and more particularly, to a dual-panel type organic electroluminescence display device and a method of fabricating the same.

2. Description of the Related Art

An organic electroluminescence display device uses a light emission phenomenon occurring when an electron in an excited state is transferred to a ground state. The organic electroluminescence display device is self-luminous, which does not require a separate backlight. The organic electroluminescence display device has advantages of a light weight, slimness, and having low power consumption, a good viewing angle characteristic, and a high contrast ratio. Additionally, the organic electroluminescence display device is formed entirely of a solid material and it may be highly resistant to an external impact and a wide operating temperature range. The organic electroluminescence display device can also be manufactured at a low cost. Particularly, an active matrix organic electroluminescence display device including a thin film transistor in each pixel may display data with uniform brightness even when a low current is applied thereto. Accordingly, low power consumption, high definition, and a large display size may be achieved.

The organic electroluminescence display device is manufactured by bonding an array substrate and an encapsulation substrate together. The array substrate includes an array device, and an organic electroluminescent diode device.

To form the array substrate, the array device and the organic electroluminescent diode device may be sequentially formed on a substrate. When a defect occurs in the organic electroluminescent diode device during a forming process, the substrate including the array device is usually discarded. In that case, manufacturing time may be wasted and material costs may increase, thereby lowering a yield.

The organic electroluminescence display device may be classified into a bottom emission type and a top emission type according to a direction where light is emitted. Since light is emitted to the array substrate in the bottom emission type organic electroluminescence display device, the device may have a high degree of freedom in process and high stability by an encapsulating process. However, the bottom emission type organic electroluminescence display device is limited in aperture ratio, and thus the application for a high-resolution product is difficult.

As for the top emission type organic electroluminescence display device, light is emitted through the encapsulation substrate. Thus, the top emission type organic electroluminescence display device may facilitate a design of a thin film transistor, and improve the aperture ratio. The top emission type organic electroluminescence display device may have a longer life span than the bottom emission type organic electroluminescence display device. However, the top emission type organic electroluminescence display device includes, on an organic luminescent layer, a cathode formed of a conductive material that transmits light. For this reason, materials that can be used for the cathode and the organic luminescent layer may be limited, and transmittance also may be limited depending on the material of the cathode. This may result in lowering light efficiency. Accordingly, there is a need of an organic electroluminescence display device and a method of fabricating the same that overcome such drawbacks.

SUMMARY

By way of example, in one embodiment, a display device includes a first substrate, a second substrate, a spacer and a connection electrode. The first substrate includes an organic electroluminescence diode device, and the second substrate faces the first substrate and includes a thin film transistor. The connection electrode is configured to electrically connect the thin film transistor and the organic electroluminescence diode device. The display device further includes a first buffer pattern configured to separate two adjacent pixel regions and a second buffer pattern overlying the first buffer pattern and having a predetermined shape. The first buffer pattern is etchable to produce a cavity between the two adjacent pixel regions. The cavity can be enlarged to the extent that the shape of the second buffer pattern is maintained.

In another embodiment, a method for fabricating a display device is provided. In the method, a pixel region is defined on a first substrate. A first buffer pattern is formed on the first substrate at the periphery of an emitting area of the pixel region. A second buffer pattern is formed. The second buffer pattern overlies the first buffer pattern and has a selected shape such that the first buffer pattern is exposed. A predetermined distance d is determined. The distance d is the distance that the first buffer pattern can be etched to the extent that the shape of the second buffer pattern is maintained. A second substrate including a thin film transistor is provided. The second substrate faces the first substrate.

In another embodiment, an organic electroluminescent diode device is formed on a first substrate. The organic electroluminescent diode device includes a first electrode, a second electrode and an emitting area. A predetermined maximum distance d of an undercut structure is determined. A first buffer pattern and a second buffer pattern are formed. The first buffer pattern is over-etched from a circumferential edge of the second buffer pattern toward the emitting area by using the second buffer pattern as a mask to form the undercut structure. The second buffer pattern can stand above the undercut structure within the maximum distance d. The first electrode and the second electrode are separated by the first and the second buffer patterns. A thin film transistor is formed on a second substrate. A space that separates the first and the second substrates is formed to electrically connect the thin film transistor and the organic electroluminescent diode device.

It is to be understood that both the foregoing general description and the following detailed description of the present invention are exemplary and explanatory and are intended to provide further explanation of the invention as claimed.

DETAILED DESCRIPTION OF THE EMBODIMENTS

Reference will now be made in detail to the preferred embodiments, examples of which are illustrated in the accompanying drawings. The invention may, however, be embodied in many different forms and should not be construed as being limited to the embodiments set forth herein.

Figure 1A:
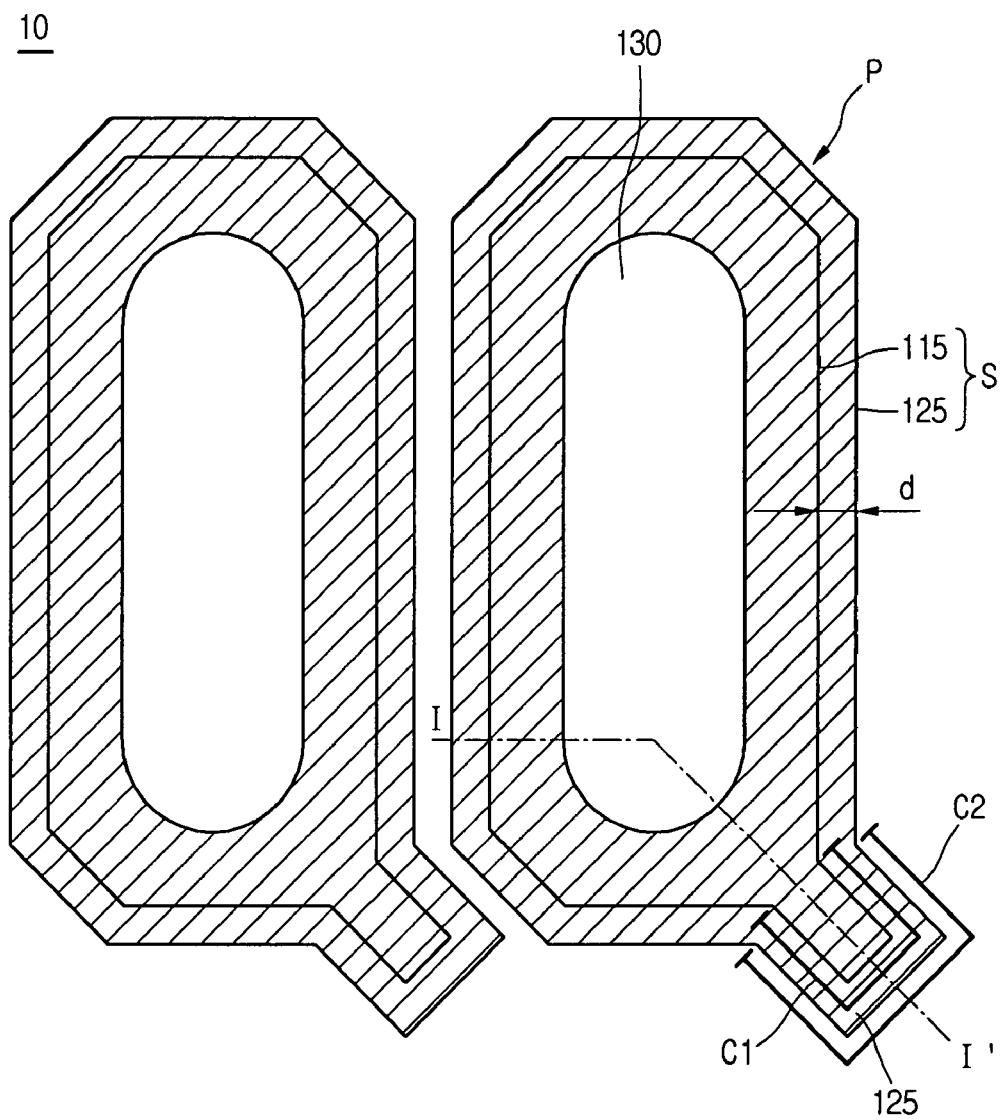
FIG. 1A is a plan view illustrating two adjacent pixel regions of an organic electroluminescent device according to one embodiment.
Figure 1B:
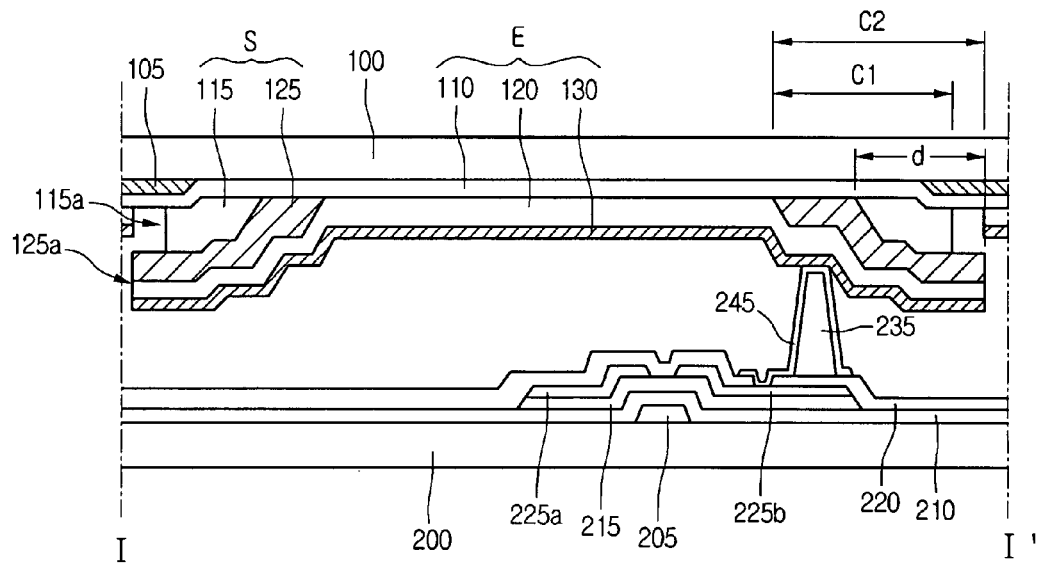
FIG. 1B is a cross-sectional view taken along line I-I' of FIG. 1A.

FIG. 1A is a plan view illustrating two adjacent pixel regions of an organic electroluminescence display device 10 according to an embodiment. FIG. 1B is a cross-sectional view taken along line I-I' of FIG. 1A. Referring to FIGS. 1A and 1B, the organic electroluminescence display device 10 includes a first substrate 100 in which a pixel region P is defined. FIG. 1A illustrates two adjacent pixel regions. The two adjacent pixel regions are separated. In FIG. 1A, a first buffer pattern 115 is formed and a second buffer pattern 125 overlies the first buffer pattern. Initially, the first buffer pattern 115 is disposed between the two adjacent pixel regions. The second buffer pattern 125 is shaped to expose the first buffer pattern 115. As will be described later, the first buffer pattern 115 is etched and removed for separating the two adjacent pixel region. FIG. 1A, each pixel region has a honeycomb shape. Various other shapes such as round shape are available.

In FIG. 1B, an organic electroluminescent diode device E is disposed in the pixel region P. The organic electroluminescent diode device E includes a first electrode 110, an organic luminescent layer 120, and a second electrode 130 that are sequentially formed in the pixel region P. An auxiliary electrode 105 is electrically connected to the first electrode 110 and is further disposed on the first substrate 100. The auxiliary electrode 105 serves to reduce resistance variations of the first electrode 110. The first electrode 110 is formed on an entire surface of the first substrate 100 and may have the high resistance variation. The brightness of the organic electroluminescence display device 10 may be affected by the resistance variation. The first electrode 110 is formed of a conductive material with high resistance, which may affect the resistance variation.

A separator S is disposed on the first electrode 110 to provide separation between the two adjacent pixel regions. The separator S is disposed on the first electrode 110 along a periphery of the emitting area of each pixel region P. As shown in FIG. 1A, the separator S covers a relatively wider area, in particular, a contact portion C1 and C2 between the two adjacent pixel regions. The separation between the two adjacent pixel regions at the contact portion is performed by considering structural support. The separation is designed such that any structure residing above the separated space can be supported and preserved. Specifically, if the separated space is too large, structure overlying such separated space may be weakened or collapse. The separator S includes the first buffer pattern 115 disposed on the first electrode 110, and the second buffer pattern 125 disposed on the first buffer pattern 115. As shown in FIG. 1A, the first buffer pattern 115 is disposed along the periphery of the emitting area of the pixel region P. A cavity is formed between a first contact portion C1 and a second contact portion C2.

The second buffer pattern 125 has a shape corresponding to the first buffer pattern 115. The second buffer pattern 125 protrudes from the emitting area of the pixel region P toward the periphery of the pixel region P farther than the first buffer pattern 115. The cavity is formed in the area where the second buffer pattern 125 is farther extended.

The cavity may be enlarged into a space corresponding to a predetermined distance d. The first outer surface 115a is disposed closer to an edge or the periphery of the emitting area of the pixel region P than the second outer surface 125a. Thus, the entire outer surface of the separator S may have an undercut structure. The distance d represents the depth of the undercut. The distance d also represents a maximum possible distance where the undercut structure can extend while the second buffer pattern 125 maintains its shape. The distance d may vary depending on various conditions, e.g., material used for the first and the second buffer patterns 115 and 125, etching time, an etchant, etc. By way of example only, the distance d may range from 0.1 to 3.0 μm. If the distance d is smaller than 0.1 μm, the separator S may be unable to sufficiently separate the second electrode 130. The second electrode 130 of the two adjacent pixel regions may be short-circuited. In contrast, if the distance d exceeds 3.0 μm, the undercut may collapse. Various other dimensions are available for the distance d.

The organic luminescent layer 120 is disposed on the first electrode 110 and the separator S. Additionally, another organic layer may be disposed on or under the organic luminescent layer 120 to improve light emission efficiency. For instance, the organic layer may include a hole injection layer, a hole transport layer, a hole blocking layer, an electron transport layer, and an electron injection layer. The organic layer properly controls energy levels at respective interfaces of the first electrode 110, the organic luminescent layer 120 and the second electrode 130. Electrons and holes may be efficiently injected to the organic luminescent layer 120. The light emission efficiency of the completed organic electroluminescence display device may improve. As noted above, the second electrode 130 is separated by the separator S for each pixel region. The second electrode 130 may be disposed on the separator S and on the organic luminescent layer 120. A portion of the second electrode 130 extends in the second contact portion C2.

A second substrate 200 is disposed facing the first substrate 100. A thin film transistor Tr is disposed on the second substrate 200 and is electrically connected to the portion of the second electrode 130 that is disposed in the second contact portion C2. A plurality of gate lines and a plurality of data lines cross each other on the second substrate 200. A thin film transistor Tr is disposed at each intersection of the two lines. The thin film transistor Tr includes a gate electrode 205, a semiconductor layer 215, and source/drain electrodes 225a and 225b. A gate insulating layer 210 is interposed between the gate electrode 205 and the semiconductor layer 215. A passivation layer 220 is disposed on an entire surface of the second substrate 200 including the thin film transistor Tr. A contact hole exposing a portion of the thin film transistor (Tr) is disposed in the passivation layer 220. A spacer 235 is disposed on the passivation layer 220 corresponding to the second contact portion C2.

The spacer 235 may be located directly above the portion of the second buffer pattern 125 where no cavity is formed. Specifically, the spacer 235 is disposed above the second buffer pattern 125 where no undercut structure is formed. Accordingly, the spacer 235 may not apply additional load or stress on the first buffer pattern 115 or the cavity, even if all of the first buffer pattern 115 is etched.

A connection electrode 245 is disposed on the passivation layer 220 and is connected to the thin film transistor (Tr) through the contact hole. Here, the connection electrode 245 covers the spacer 235. Thus, the connection electrode 245 protrudes upwardly around the spacer 235. The connection electrode 245 contacts the portion of the second electrode 130 that is disposed in the second contact portion C2. Accordingly, the thin film transistor Tr and the organic electroluminescent diode device E are electrically connected to each other. Then, the thin film transistor (Tr) drives the organic electroluminescent diode device E to emit light, and the emitted light passes through the second substrate 200 to provide an image to a user.

The spacer 235 serves to maintain a cell gap between the first substrate 100 and the second substrate 200. In this embodiment, the spacer 235 is formed on the second substrate 200. In other embodiment, the spacer 235 may be formed between the first substrate 100 and the second electrode 130. The second contact portion C2 disposed at the periphery of the pixel region P may prevent deterioration of light transmittance in the pixel region P, thereby increasing the brightness of the organic electroluminescence display device 10.

Figure 2A:
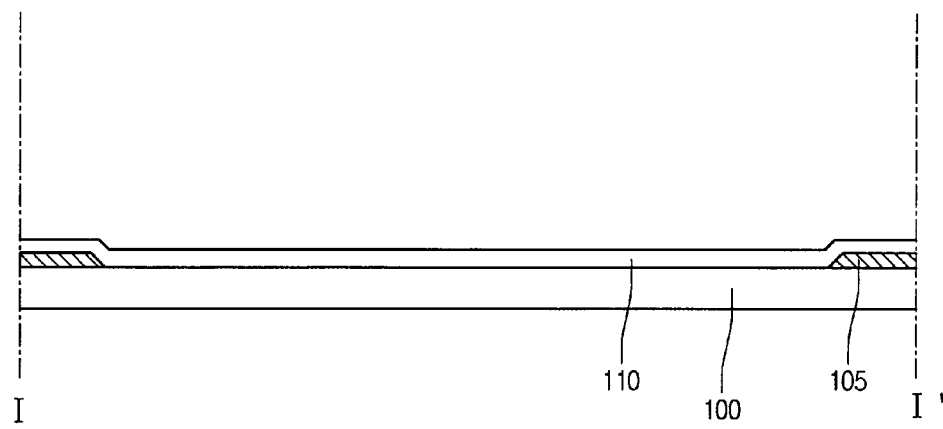
FIGS. 2A through 2E are cross-sectional views for describing a method of fabricating an organic electroluminescence display device of FIG. 1A.

FIGS. 2A through 2E are cross-sectional views illustrating one embodiment of a method of fabricating the organic electroluminescence display device 10 of FIGS. 1A and 1B. Referring to FIG. 2A, a first substrate 100 is provided. A plurality of sub-pixels is defined in the first substrate 100. The first substrate 100 may be formed of a transparent material, such as glass or plastic.

A conductive material with lower resistance than that of the first electrode 110 is deposited on the first substrate 100 to form a conductive layer. Then, the conductive layer is etched to form an auxiliary electrode 105. The auxiliary electrode 105 serves to reduce resistance variation of the first electrode 110 formed in a subsequent process. The auxiliary electrode 105 may be made from Al, AlNd, Mo, or Cr, but it is not limited thereto.

A transparent conductive material is deposited on the first substrate 100 including the auxiliary electrode 105. The transparent conductive material is etched to form the first electrode 110. The transparent conductive layer may be made from, for instance, indium tin oxide (ITO), and indium zinc oxide (IZO). The transparent first electrode 110 is formed on the first substrate 100, and light may provide an image to a user through the first substrate 100. Accordingly, the organic electroluminescence display device may have excellent transmittance. The organic electroluminescence display device may provide improved light efficiency.

Figure 2B:
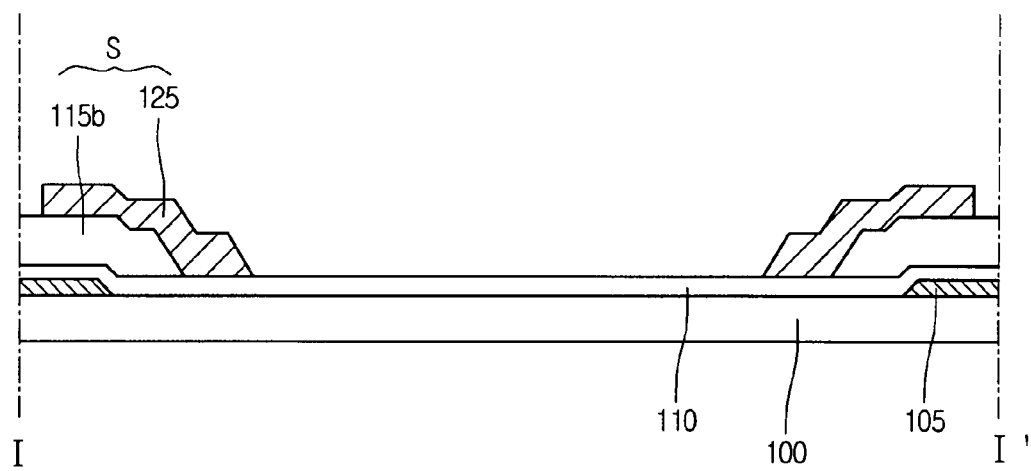

Referring to FIG. 2B, a preliminary first buffer pattern 115b and the second buffer pattern 125 are formed sequentially on the first electrode 110 along the emitting area of the pixel region P. The contact portion C1 and C2 protrudes from each pixel region. The preliminary first buffer pattern 115b may be formed of an inorganic insulating material. For example, the first buffer pattern 115b may be a silicon oxide pattern, a silicon nitride pattern, or a stacked pattern of both the silicon oxide pattern and the silicon nitride pattern. The second buffer pattern 125 may be formed of an organic insulating material. To simplify a manufacturing process, the organic insulating material may be a photoresist resin. For example, the organic insulating material may be an acryl-based resin, a benzocyclobutene (BCB)-based resin, a polyimide-based resin, or a novolak-based resin.

Figure 2C:
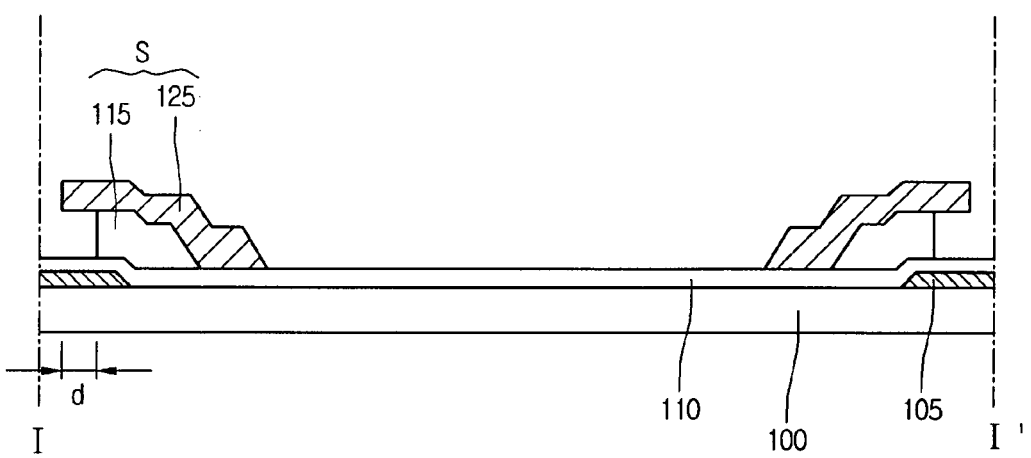

Referring to FIG. 2C, the preliminary first buffer pattern 115b is etched by using the second buffer pattern 125 as an etch mask to form the first buffer pattern 115. To form the outer surface of the separator S in the form of an undercut, the first buffer pattern 115 is over-etched. The first buffer pattern 115 is selectively etched and the second buffer pattern 125 may not be etched. Materials used for the first buffer pattern 115 and the second buffer pattern 125 may be selected such that selective etching of the first buffer pattern 115 is performed. Etchant also may be chosen for the selective etching. As noted above, the distance d represents the maximum possible depth of the undercut. For example, the distance d may range from 0.5 to 3.0 μm. The first buffer pattern 115 may be over-etchable as long as it is within the distance d. Even if no first buffer pattern 115 remains under the second buffer structure 125, the second buffer structure 125 can maintain its shape and may not collapse. The first buffer pattern 115 can be over-etched within any distance between 0 and d. Additionally, all of the first buffer pattern 115 may be etched and the cavity occupies all of the space under the second buffer structure 125. The width of the first buffer pattern 115 is smaller than the distance d. The cavity is formed and occupies the space created by the undercut structure. The separator S including the first buffer pattern 115 and the second buffer pattern 125 is formed on the first electrode 110. The separator S on the first electrode 110 serves to separate the second electrode 130 for each pixel region, as will be described in detail below.

Figure 2D:
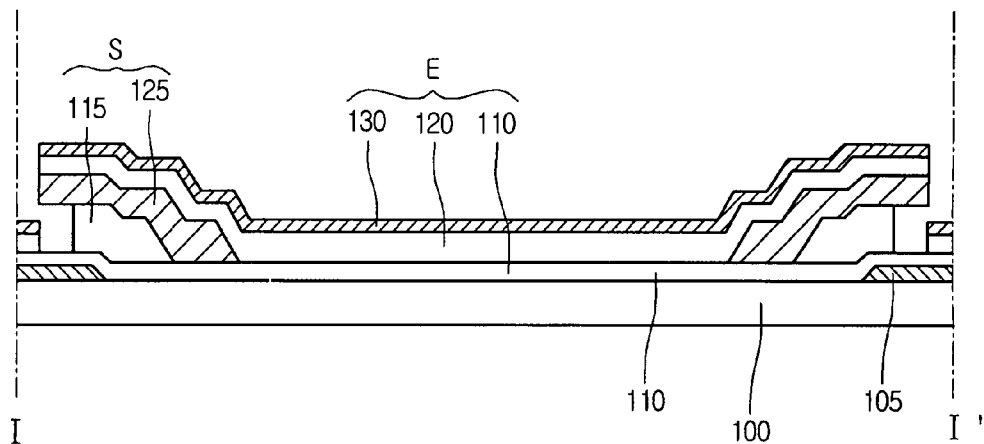

Referring to FIG. 2D, an organic luminescent layer 120 is formed on the first electrode 110. The organic luminescent layer 120 may be formed of a low-molecular or high-molecular material. When the organic luminescent layer 120 is formed of the low-molecular material, the organic luminescent layer 120 may be formed with a vacuum deposition method. When the organic luminescent layer 120 is formed of the high-molecular material, the organic luminescent layer 120 may be formed with an inkjet printing method. Before or after the organic luminescent layer 120 is formed, at least one organic layer selected from the group consisting of a hole injection layer, a hole transport layer, a hole blocking layer, an electron transport layer, and an electron injection layer may be additionally formed.

Subsequently, the second electrode 130 is formed on the organic luminescent layer 120. The second electrode 130 is automatically separated for each pixel region by the separator S during a process of depositing a conductive material. The second electrode 130 is formed on the second contact portion C2 and the organic luminescent layer 120. In such a manner, the organic electroluminescent diode device E including the first electrode 110, the organic luminescent layer 120, and the second electrode 130 separated for each pixel region by the separator S may be formed on the first substrate 100.

Figure 2E:
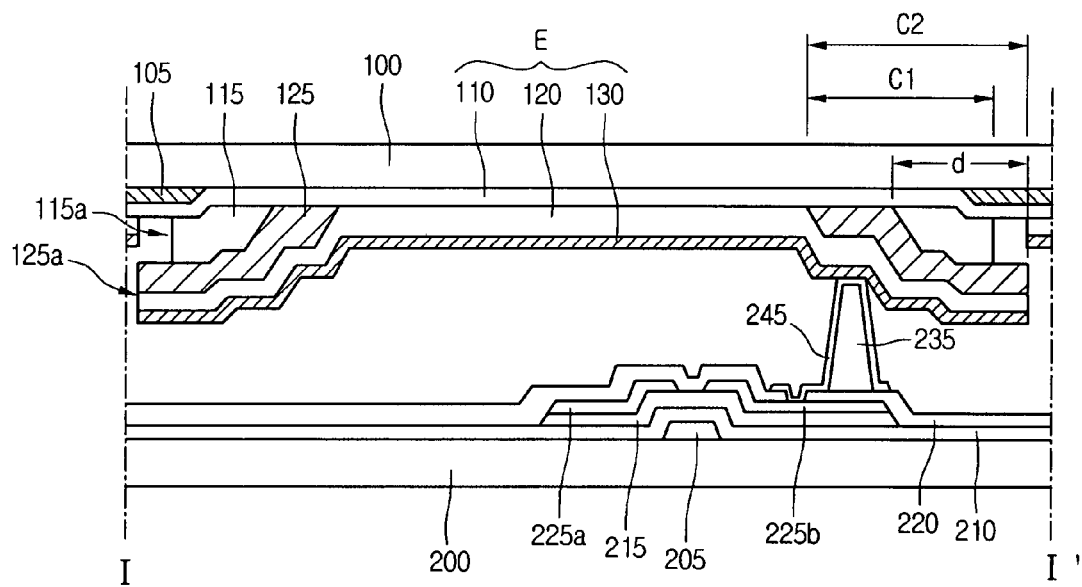

Referring to FIG. 2E, the second substrate 200 including the thin film transistor Tr and the connection electrode 245 is provided. The thin film transistor Tr is formed on the second substrate 200. The passivation layer 220 covering the thin film transistor Tr is formed. The contact hole exposing a portion of the thin film transistor Tr is formed in the passivation layer 220. The spacer 235 is formed on a portion of the passivation layer 220 that corresponds to the second contact portion C2. The connection electrode 245 is formed to cover the spacer 235 and be electrically connected to the thin film transistor Tr. The connection electrode 245 protrudes upwardly by the spacer 235.

A seal pattern is formed along an outer edge of the first substrate 100 or the second substrate 200. Then, the first substrate 100 and the second substrate 200 are bonded together, such that the organic electroluminescent diode device E of the first substrate 100 faces the thin film transistor Tr of the second substrate 200. The connection electrode 245 protruding by the spacer 235 and the second electrode 130 formed on the second contact portion C2 contact each other. In this manner, the thin film transistor and the organic electroluminescent diode device E on the different substrates are electrically connected to each other. The thin film transistor (Tr) and the organic electroluminescent diode device E are formed on the different substrates, thereby saving material costs and associated expenses incurred by defects.

The top emission type organic electroluminescence display device emits light through the first substrate 100, so that light transmittance may improve. Since the separate contact portions are formed at the outer edge of the pixel region, an aperture ratio and the brightness may improve. Further, the separator S including the contact portions is formed, and a short circuit of the first electrode and the second electrode may be prevented.

The organic electroluminescence display device described above may reduce defects and improve efficiency in production management. Manufacturing processes of the thin film transistor and the organic electroluminescent diode may be separately and independently performed. Further, the organic electroluminescence display device may achieve process stabilization.

The organic electroluminescence display device described above may provide the separation between adjacent pixel regions without structural concern. The second buffer pattern can maintain its shape and position while the first buffer pattern is etched and the cavity is formed. The maximum possible distance d is determined such that the maximum separation is possible and that the structural stability is also maintained. Even if the separation occurs at the relatively wide area such as the contact portion, the adjacent pixel regions may be safely and effectively separated.

It will be apparent to those skilled in the art that various modifications and variations can be made in the present invention. Thus, it is intended that the present invention covers the modifications and variations of this invention provided they come within the scope of the appended claims and their equivalents.

We claim:

1. A display device, comprising:
   a first substrate including an organic electroluminescence diode device;
   a second substrate facing the first substrate and including a thin film transistor;
   a connection electrode configured to electrically connect the thin film transistor and the organic electroluminescence diode device, wherein the organic electroluminescence diode device comprises a first electrode and a second electrode separated by an organic luminescent layer;
   a first buffer pattern configured to separate two adjacent pixel regions;
   a second buffer pattern overlying the first buffer pattern and having a predetermined shape;
   a auxiliary electrode disposed between the first substrate and the first electrode of the organic electroluminescence device in the first buffer pattern;
   a separation portion where the first electrode and the second electrode are further separated by the first and the second buffer patterns, wherein the separation portion is located on the second electrode such that the separation portion is overlapped with the first and the second buffer patterns; and
   a spacer disposed on between the second electrode and the a drain electrode of the thin film transistor, wherein the spacer and the second buffer pattern face each other;
   wherein the first buffer pattern is etched to produce a cavity disposed between the two adjacent pixel regions and the cavity can be enlarged to the extent that the shape of the second buffer pattern is maintained, and
   wherein a surface of the spacer is covered by a connection electrode, wherein the connection electrode is directly contacted to the drain electrode,
   wherein the drain electrode and the second electrode facing the second buffer pattern are connected by the connection electrode,
   wherein the second buffer pattern extends from an emitting area of the pixel region farther than the first buffer pattern and the cavity is formed where the second buffer pattern is extended farther from the emitting area of the pixel region than the first buffer pattern,
   wherein the spacer is disposed on an extended region of the second buffer that is not overlapped with the first buffer pattern,
   wherein the extended region of the second buffer pattern does not overlap with the cavity.

2. The device of claim 1, wherein the second buffer pattern operates as a mask which shields the first buffer pattern from an etchant.

3. The device of claim 1, wherein the separation portion is formed away from the emitting area of a pixel region.

4. The device of claim 1, wherein the cavity ranges between 0.1 μm and 3.0 μm, wherein the cavity is a distance between the edges of the first buffer pattern and the second buffer pattern.

5. A method for fabricating a display device, comprising:
   forming a auxiliary electrode on a first substrate;
   forming an organic electroluminescent diode device on the first substrate wherein the organic electroluminescent diode device comprises a first electrode, a second electrode and an emitting area;
   determining a predetermined maximum distance d of an undercut structure;
   forming a first buffer pattern and a second buffer pattern;
   over-etching the first buffer pattern from a circumferential edge of the second buffer pattern toward the emitting area by using the second buffer pattern as a mask to form the undercut structure wherein the second buffer pattern can stand above the undercut structure within the maximum distance d;
   separating the first electrode and the second electrode by the first and the second buffer patterns;
   forming a thin film transistor on a second substrate; and
   forming a spacer that separates the first substrate and the second substrate to electrically connect the thin film transistor and the organic electroluminescent diode device;
   forming a connection electrode to cover a surface of the spacer, wherein the spacer and the second buffer pattern face each other, wherein the connection electrode is directly contacted to the drain electrode,
   forming a cavity that occupies the undercut structure, wherein the connection electrode is electrically connected to between a drain electrode of the thin film transistor and the second electrode facing the second buffer pattern, wherein the second buffer pattern extends from the emitting area of a pixel region farther than the first buffer pattern and the cavity is formed where the second buffer pattern is extended farther from the emitting area of the pixel region than the first buffer pattern, and wherein the spacer is disposed on an extended region of the second buffer pattern that is not overlapped with the first buffer pattern, wherein the extended region of the second buffer pattern does not overlap with the cavity.

6. The method of claim 5, wherein the undercut structure ranges between 0.1 μm and 3.0 μm, wherein the undercut structure is a distance between the edges of the first buffer pattern and the second buffer pattern.

7. The method of claim 5, wherein forming the first buffer pattern comprises forming the first buffer pattern with an inorganic material or metal.

8. The method of claim 5, wherein forming the second buffer pattern comprises forming the second buffer pattern with an organic material.

9. The method of claim 5, wherein forming the first buffer pattern and the second buffer pattern comprises selectively etching the first buffer pattern wherein the second buffer pattern is not etched.

10. The method of claim 9, wherein forming the first buffer pattern and the second buffer pattern comprises adjusting an etching time of the first buffer pattern based on the determined distance d.

11. The method of claim 5, wherein a width of the first buffer pattern is smaller than the distance d.

* * * * *